United States Patent
Ota et al.

(10) Patent No.: US 6,335,218 B1
(45) Date of Patent: Jan. 1, 2002

(54) METHOD FOR FABRICATING A GROUP III NITRIDE SEMICONDUCTOR DEVICE

(75) Inventors: Hiroyuki Ota; Mamoru Miyachi; Yoshinori Kimura, all of Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/565,025

(22) Filed: May 5, 2000

(30) Foreign Application Priority Data

May 10, 1999 (JP) .......................................... 11-128768

(51) Int. Cl.$^7$ .............................................. H01L 21/00
(52) U.S. Cl. ...................................................... 438/46
(58) Field of Search .............................. 438/5, 45, 46, 438/47, 507, 509, 935; 117/89, 93, 104, 201, 202, 952; 257/96, 97, 103; 372/43, 50

(56) References Cited

U.S. PATENT DOCUMENTS 5,656,832 A * 8/1997 Ohba et al. .................. 257/190

FOREIGN PATENT DOCUMENTS

JP          09199758       11/1997

OTHER PUBLICATIONS

Lisa Sugiura et al., "P–Type Conduction In As–Grown Mg–Doped GaN Grown By Metalorganic Chemical Vapor Deposition", Applied Physics Letters, American Institute of Physics, Apr. 6, 1998,vol. 72, No. 14, pp. 1748–1750.

Shuji Nakamura et al., "Thermal Annealing Effects On P–Type Mg–Doped GaN Films", Japan J. Applied Physics, vol. 31(1992), pp. 139–142.

Hiroshi Amano et al., P–Type Conduction in Mg–Doped GaN Treated with Low–Energy Electron Beam Irradiation (LEEBI), Japanese Journal of Applied Physics, vol. 28, No. 12, Dec. 1989, pp. 2112–2114.

Shuji Nakamura et al., "Hole Compensation Mechanism Of P–Type GaN Films", Japan J. Applied Physics, vol. 31 (1992), pp. 1258–1266.

* cited by examiner

Primary Examiner—Keith Christianson
(74) Attorney, Agent, or Firm—Morgan, Lewis & Bockius LLP

(57) ABSTRACT

A group III nitride semiconductor device producing method is constructed by: a step of forming a first crystal layer made of a group III nitride semiconductor $(Al_xGa_{1-x})_{1-y}In_yN$ ($0 \leq x \leq 1$, $0 \leq y \leq 1$) doped with a group II impurity element; a step of a second crystal layer made of a group III nitride semiconductor $Al_zGa_{1-z}N$ ($0.7 \leq z \leq 1$) onto the first crystal layer; and a step of removing at least a part of the second crystal layer by etching after the formation of the first and second crystal layers.

8 Claims, 5 Drawing Sheets

VOLTAGE-CURRENT CHARACTERISTICS

METHOD FOR FABRICATING A GROUP III NITRIDE SEMICONDUCTOR DEVICE

BACKGROUND OF THE INVENTION

1. Field of the Invention

The invention relates to a group III nitride semiconductor device (also simply referred to as a device, hereinafter) and, more particularly, to a method of producing the device.

2. Description of the Related Art

In the field of light emitting devices such as light emitting diodes, semiconductor laser diodes or the like, a semiconductor light emitting device having a crystal layer obtained by adding a group II element such as magnesium (Mg), zinc (Zn) or the like into a single crystalline group III nitride semiconductor $(Al_xGa_{1-x})_{1-y}In_yN$ ($0 \leq x \leq 1$, $0 \leq y \leq 1$) attracts much attention as a device which can emit a blue light.

Epitaxial growth of nitride semiconductor is generally performed by a metalorganic chemical vapor deposition (MOCVD) method. An as-grown layer of a group III nitride semiconductor crystal $(Al_xGa_{1-x})_{1-y}In_yN$ ($0 \leq x \leq 1, 0 \leq y \leq 1$) element such as Mg, Zn has been added by using MOCVD, however, usually exhibits extremely high resistivity. Attempts to achieve a blue light emitter using this material have been hampered by this inability of p-type conduction.

In recent years, it has been reported that low-resistivity p-type could be obtained by performing a special treatment to the high-resistivity $(Al_xGa_{1-x})_{1-y}In_yN$ ($0 \leq x \leq 1, 0 \leq y \leq 1$) doped with group II element such as Mg. H. Amano et al. found out that low-resistivity p-type conduction was realized by performing a low-energy electron-beam irradiation to the crystal (H. Amanoetal. :Jpn. J. Appl. Phys. Vol.28, 1989, pp.L2112–2114). S. Nakamura et al. has found out that a low-resistivity p-type crystal can be also realized by performing a heat treatment to the crystal at a temperature in a range from approximately 700 to 800° C. in nitrogen ambient under atmospheric pressure or under high pressure (S. Nakamura et al.: Jpn. J. Appl. Phys. Vol.31, 1992, pp. L139–142).

The mechanism of the treatment for establishing those p-type conduction is interpreted in such a manner that, the hydrogen atoms which passivate the group II acceptor impurities such as Mg or the like by combining with them in the grown film are dissociated by the above treatments.

According to the above method of the low-energy electron-beam irradiation, an extremely high room temperature hole concentration on the order of E18/cc is obtained in a resultant p-type crystal. However, a treated depth is limited within a penetration depth of the electron beam and, for example, the treated depth is equal to about 0.3 μm with an accelerating voltage of 6 to 30 kV (S. Nakamura et al.: Jpn. J. Appl. Phys. Vol.31. 1992, pp. L139–142). Since the low-energy electron-beam irradiation treatment is performed by scanning the wafer surface with an electron beam in a vacuum vessel, the equipment is apt to be bulky and moreover a long treatment time is needed, so that this method is unfavorable for the mass production of the laser devices.

On the other hand, the above method of the heat treatment is free from the strict limitation of the treated depth as in the case of the low-energy electron-beam irradiation process. It is considered that the heat treatment is suitable for mass production since a number of wafers can be treated in a batch by a heating furnace.

In the case of producing a semiconductor laser device by using the heat treatment as mentioned above, a contact resistance at an electrode of the device remains as a problem, since the room-temperature hole concentration adjacent to the electrode is equal to approximately 3E17/cc. If a treatment temperature is raised in an attempt to increase the hole concentration of the film as a whole, electric characteristics of the device are contrarily deteriorated. It is thought that this is because nitrogen vacancies are generated near the film surface due to nitrogen dissociation, the nitrogen vacancies act as donors and compensate the acceptors, and the hole concentration in a region near the surface contrarily decreases. A contact characteristic of the electrode is, consequently, deteriorated.

OBJECT AND SUMMARY OF THE INVENTION

Several countermeasures against the nitrogen dissociation problem as mentioned above are conceivable.

For example, as a first countermeasure, there is a method of extremely raising the pressure of nitrogen ambient for the heat treatment. It has been found that if the heat treatment is performed under a high nitrogen pressure of approximately 90 atm, no surface degradation occurs even at a temperature of approximately 1000° C. (S. Nakamura et al.: Jpn. J. A.ppl. Phys. Vol.31, 1992, pp. L1258–1266).

In the case of using the above method, however, since an extremely high pressure and temperature used in the process requires a special chamber for the heat treatment, resulting in an obstacle to the realization of mass production.

There is a second countermeasure against the nitrogen dissociation problem in which a protecting film or cap layer made of another material is formed on a crystal layer of the group III nitride semiconductor doped with the group II impurity element and, thereafter, the heat treatment is performed. The material of the protecting film is required to have hydrogen permeability so as not to obstruct the elimination of hydrogen while preventing the dissociation of nitrogen from the crystal. Silicon dioxide ($SiO_2$), silicon nitride ($Si_3N_4$), aluminum nitride (AlN) and the like can be mentioned as candidate materials which can endure the temperature condition to be used for the heat treatment as mentioned above.

The protecting film $SiO_2$ is stable at a comparative high temperature and can be easily removed by wet etching using hydrofluoric acid (HF) or the like. Since GaN is hardly eroded by HF, the protecting film $SiO_2$ formed on a GaN layer has such an advantage that the HF etching is automatically stopped at a time when the proper amount of film is etched. There are, however, the following drawbacks.

An $SiO_2$ film is formed by a sputtering method or the like, o (oxygen) deficiency fends to occur during the film formation to become $SiO_x$ (where subscripted x denotes an atom ratio), so that sputtering has to be performed while adding an oxygen gas. In this instance, oxygen penetrates into the nitride semiconductor film. Since oxygen acts as a donor in the group III nitride semiconductor to compensates the acceptor in the crystal of the group III nitride semiconductor doped with group II impurity, the hole concentration in a region near the surface of the group III nitride semiconductor is contrarily decreased. As a result, an expected effect cannot be derived.

A cap layer of $Si_3N_4$ also has sufficient high-temperature stability, however, due to its extremely high chemical stability, it is difficult to be removed by chemical etching, An RIE (reactive ion etching) therefore, has to be used for removing the $Si_3N_4$ film. In removal of the cap layer, etch selectivity mentioned above becomes a serious requirement. The ideal selectivity is that obtained for the etching of $SiO_2$ layer on GaN layer by HF.

The thickness of each constituent layer of a device is of great importance, especially for laser diode. The uppermost layer, namely, a contact layer (Mg doped GaN layer in this case) for an electrode of the device is formed to have a relatively small thickness of 0.1 μm. Since high selectivity cannot in RIE, it is extremely difficult to remove the $Si_3N_4$ cap layer completely while leasing the contact layer with a predetermined thickness.

To realize a practical laser device, it is necessary to form some refractive index waveguide structure in the device. The waveguide structure most generally used is what is called a ridge structure. Although a ridge structure can be formed by removing some portions of the semiconductor crystal layer (while) leaving a thin ridge portion, a precise control is required on the removal. Since the ridge forming step is performed after the cap layer removing step, the error caused in the cap layer removing step is directly reflected to an error of a ridge height.

There arises further inconvenience that, since RIE utilizes a plasma unlike pure by chemical etching, the crystal surface was to be irradiated with high energy particles, so that crystal defects are formed on the surface. Since the existence of those defects deteriorates the contact of electrode, an expected effect cannot be derived also in this case.

Although AlN is a group III nitride semiconductor similar to GaN, it has much better high-temperature stability than that of GaN and hardly dissociates at a heat treatment temperature within a range from 800 to 1000° C. In the case of using AlN as a material for the protecting film, the film may be formed by a reactive sputtering using an aluminum target and nitrogen gas ($N_2$). In this case, it is considered that no oxygen penetration occurs during the formation of the protecting film.

Since AlN can be easily chemically etched in a heated potassium hydroxide (KOH) aqueous solution and GaN (at least monocrystalline GaN which is used here) is never eroded under this condition, the etching automatically stops at the interface between them, so that it is very convenient.

An experiment reveals, however, that sufficient effect, namely, an enough improvement of the p-side electrode characteristics cannot be derived. It is considered that this is because the hydrogen permeability of AlN is insufficient.

The third countermeasure method against the nitrogen dissociation problem is as follows: A crystal layer of an n-type group III nitride semiconductor is subsequently formed on the crystal layer of the group III nitride semiconductor doped with the group II impurity element and, after the completion of the growth, the crystal layer of the n-type group III nitride semiconductor is removed.

The above method is based on the findings that most of the hydrogen atoms which passivate the acceptors in the crystal of group III nitride semiconductor doped with group II impurity are those diffused into the crystal through the surface during the cooling step after the growth, and that hydrogen atoms hardly penetrate an n-type semiconductor layer. While this procedure is advantageous in that it does not require any post-growth heat treatment. The n-type layer tends to be thick(in oder)to obtain a sufficient p-type conductivity in the underlying Mg-doped film.

The third method also has the drawbacks mentioned with respect to the second method. That is, the dry etching such as RIE or the like is necessary to remove the n-type layer, there is no selectivity in dry etching between the cap layer (i.e., n-type GaN layer here) to be removed and the underlying layers (i.e., Mg doped GaN layer here).

Since AlN can be chemically etched with KOH aqueous solution, as mentioned above in the description of AlN protecting layer, if the cap surface layer is made of AlGaN having a high AlN composition ratio (>50%), chemical etching can be applied with a high selectivity. However, it is known that AlGaN in this composition range becomes an insulating material irrespective of the addition of impurities. This is because a general donor impurity such as Si, O, or the like does not act as an effective donor in this composition range as is theoretically supported. The diffusion and penetration of hydrogen atoms, therefore, cannot be prevented when using AlGaN of this composition range.

As explained above, there has been no method of producing the group III nitride semiconductor device having a high hole concentration in the p-type GaN film without degrading the electrode characteristics, process accuracy, and productivity when applied to laser devices.

It is, therefore, an object of the invention to provide a group III nitride semiconductor device producing method which can improve a hole concentration and obtain an sufficient effect without causing a burden on a device producing step in order to realize a crystal layer of low-resistivity p-type.

According to the invention, there is provided a method of fabricating a group III nitride semiconductor device, comprising the steps of:

forming a first crystal layer made of a group III nitride semiconductor $(Al_xGa_{1-x})_{1-y}In_yN$ ($0 \leq x \leq 1$, $0 \leq y \leq 1$) doped with a group II impurity element;

forming a second crystal layer made of a second group III nitride semiconductor $Al_zGa_{1-z}N$ ($0.7 \leq z \leq 1$) onto the first crystal layer; and removing at least a part of the second crystal layer by etching after the formation of the first and second crystal layers.

In an aspect of the fabrication method according to the invention, the step of forming the second crystal layer is started at substantially the same temperature as a forming temperature of the first crystal layer.

In another aspect of the fabrication method according to the invention, the first and second crystal layers are formed by a metalorganic compound chemical vapor deposition method.

In a further aspect of the fabrication method according to the invention, a nitrogen precursor in the metalorganic chemical vapor deposition method is ammonia.

As to a still further aspect of the fabrication method according to the invention, the amount of ammonia supplied into the reactor vessel is set much lower during the growth of the second crystal layer and the subsequent cooling stop or during the cooling step alone than that for the growth of the first crystal layer.

In another aspect of the fabrication method according to the invention, at the end of the growth of the second crystal layer, the shut off of (or the feed of) group III precursor.

In a further aspect of the fabrication method according to the invention, at the end of formation of the second crystal layer, supply of group III precursor is terminated and cooling is started at the when the indication of ammonia detector attached to the exhaust line of the reactor falls below a predetermined value.

In a still further aspect of the fabrication method according to the invention, the step of formation of the second crystal layer includes a usage of nitrogen gas as a carrier gas.

According to the method of producing group III nitride semiconductor device of the invention, AlN film formed is used as a cap layer, i.e., a second crystal layer onto the group III nitride semiconductor layer doped with group II impurity, i.e., a first crystal layer, amount of ammonia ($NH_3$) which is introduced into a reactor vessel is exceptionally reduced when the AlN layer is grown. Moreover, the AlN cap layer is removed by chemical etching with a sufficient selectivity to underlying GaN, so that a device wafer having the first crystal layer whose surface has a high hole concentration can be obtained without any post-growth heat treatment.

DETAILED DESCRIPTION OF THE PREFERRED EMBODIMENT

A device producing method according to the invention will now be described hereinbelow with reference to the accompanying drawings by using an embodiment.

Figure 1:
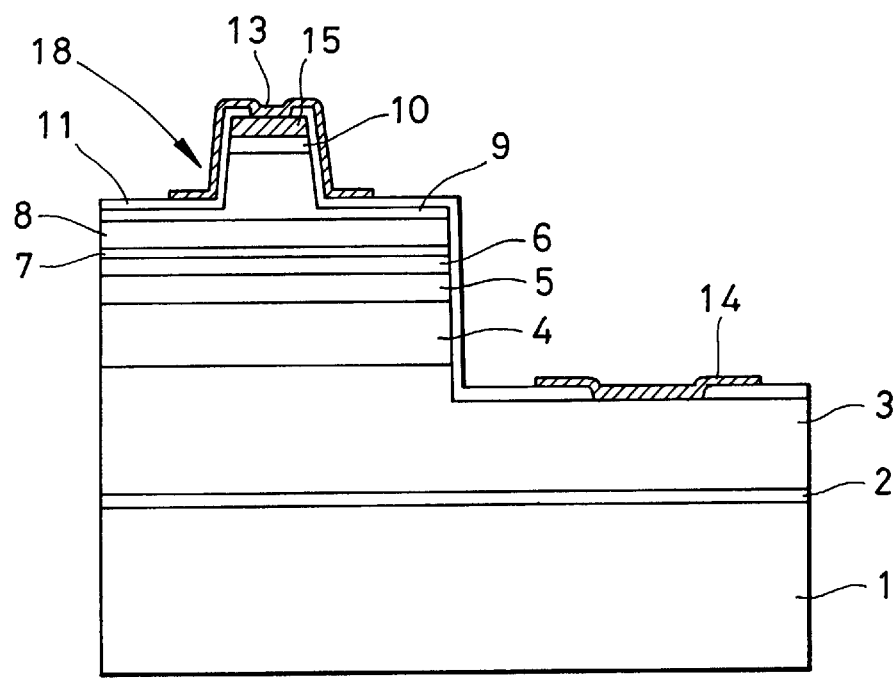
FIG. 1 is a schematic cross sectional view showing a ridge type semiconductor laser device produced by an embodiment according to the invention.

FIG. 1 shows an example of a semiconductor laser device using a group III nitride semiconductor and relates to a ridge type laser device having an SCH (Separate Confinement Heterostructure) structure. The semiconductor laser device is constituted of a GaN (or AlN) layer 2 formed at a low temperature, an n-type GaN layer 3, an n-type $Al_{0.1}Ga_{0.9}N$ layer 4, an n-type GaN layer 5, an active layer 6 mainly containing InGaN, a p-type $Al_{0.2}Ga_{0.8}N$ layer 7, a p-type GaN layer 8, a p-type $Al_{0.1}Ga_{0.9}N$ layer 9, and a p-type GaN layer 10 which are layered on a single-crystal sapphire substrate 1 in order. An n-side electrode 14 and p-side electrodes 13 and 15 are connected to the n-type GaN layer 3 and p-type GaN layer 10, respectively. A ridge portion 18 is formed on the p-type $Al_{0.1}Ga_{0.9}N$ layer 9. The device is covered with and protected by an insulating film 11 made of $SiO_2$ except window portions for the electrodes.

This semiconductor laser device emits light by recombining electrons with holes in the active layer 6. The n-type GaN layer 5 and p-type GaN layer 8 serve as guiding layers. Light generated in the active layer 6 is guided in the guiding layers 5 and 8. Electrons and holes are effectively confined into the active layer 6 by setting band gaps of the guiding layers 5 and 8 to values larger than that of the active layer 6. The p-type $Al_{0.2}Ga_{0.8}N$ layer 7 serves as a barrier layer for further enhancing the confinement of carriers (particularly, electrons). The n-type $Al_{0.1}Ga_{0.9}N$ layer 4 and the p-type $Al_{0.1}Ga_{0.9}N$ layer 9 serve as cladding layers respectively each formed to have refractive indexes lower than those of the guiding layers 5 and 8. The wave-guiding in the lateral direction is performed due to the difference between refractive indexes of the cladding layer and the guide layer. The ridge portion 18 is formed in order to produce a lateral-directional step in effective refractive index by changing the thickness of the cladding layer 9, thereby confining the generated light in the lateral direction. The n-type GaN layer 3 is a ground layer formed as a current path because sapphire substrate has no electric conductivity. The GaN (or AlN) layer 2, so-called buffer layer, is formed at a low temperature to ensure a growth of smooth GaN film on the sapphire substrate which is a dissimilar material to GaN.

The device structure shown in FIG. 1 is fabricated in the following fabricating steps through the metal-organic chemical vapor deposition (MOCVD).

Figure 2:
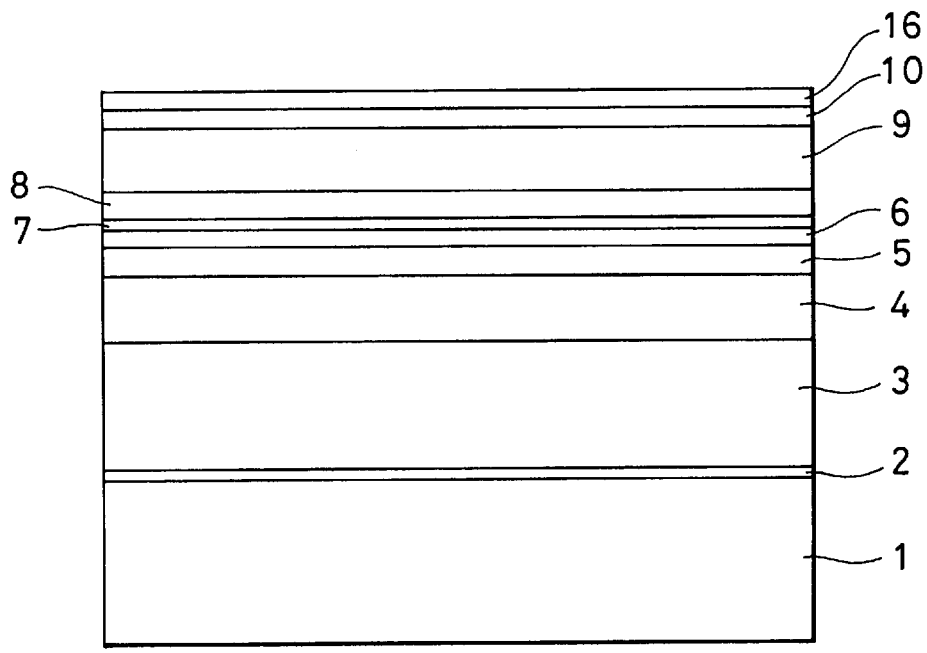
FIGS. 2 to 8 are schematic cross sectional views each showing a laser wafer during a producing step of a semiconductor laser of an embodiment according to the invention.

First, FIG. 2 shows a sectional view of a target laser wafer prepared through the following steps. A sapphire substrate 1 is set into an MOCVD reactor and held for 10 minutes in a hydrogen-gas flow at a pressure of 300 Torr and a temperature of 1050° C. to thermally clean the surface of the sapphire substrate 1. Thereafter, the temperature of the sapphire substrate 1 is lowered to 600° C., and ammonia ($NH_3$) which is a nitrogen precursor and TMA (trimethyl aluminium) which is an Al precursor are introduced into the reactor to deposit a buffer layer 2 made of AlN up to a thickness of 20 nm.

Subsequently, the supply of TMA is stopped, the temperature of the sapphire substrate 1 on which the buffer layer 2 is formed is raised to 1050° C. again while flowing only $NH_3$, and then TMG (trimethyl gallium) is introduced to form the n-type GaN ground layer 3 on the buffer layer 2. In this case, Me—$SiH_3$ (methyl silane) is added into a growth atmosphere gas as the precursor of Si which serves an n-type impurity.

When the n-type GaN ground layer 3 is grown up to 4 $\mu$m, only the supply of TMG is stopped. The the supply of Me—$SiH_3$ (methyl silane) is continued while its supply amount is increased. After such a condition is maintained for 5 minutes, the supply amount of Me—$SiH_3$ (methyl silane) is reduced down to a necessary value to establish a n-type layer, and then TMG is introduced again and also TMA is added to form the n-type AlGaN cladding layer 4.

When the n-type AlGaN cladding layer 4 is grown up to approximately 0.5 $\mu$m, the supply of TMA is stopped to grow the n-type GaN guide layer 5 up to 0.1 $\mu$m. When the growth of the n-type GaN guide layer 5 is completed, the supply of TMG and Me—$SiH_3$ is stopped, and lowering of temperature is started to set the substrate temperature at 750° C.

When the substrate temperature reaches to 750° C., the carrier gas is switched from hydrogen to nitrogen. When the gas-flow state is stabilized, TMG, TMI, and Me—$SiH_3$ are introduced to grow a barrier layer. Subsequently, the supply of Me—$SiH_3$ is stopped and then the flow rate of TMI is increased so that a well layer having an In composition ratio greater than that of the barrier layer is grown on the barrier layer. The growths of the barrier layer and the well layer are repeated in pairs in accordance with the number of wells in the designed multiple quantum well structure. In this way, an active layer 6 of the multiple quantum well structure is formed.

When the growth of active layer is completed by growing the last barrier layer on the last well layer, the supply of TMG, TMI, and Me—$SiH_3$ is stopped, and the carrier gas is changed from nitrogen to hydrogen. When the gas-flow is stabilized, the substrate temperature is raised to 1050° C. again, and TMG, TMA, and Et-$CP_2Mg$ (ethyl cyclopentadienyl magnesium) as the precursor of Mg which serves as a p-type impurity are introduced to form the p-type AlGaN layer 7 on the active layer 6 up to 0.01 $\mu$m.

Subsequently, the supply of TMA is stopped to grow the p-type GaN guide layer 8 up to 0.1 $\mu$m and then TMA is introduced again to grow the p-type AlGaN cladding layer 9 up to 0.5 $\mu$m. The p-type GaN contact layer 10 is grown on the layer 9 up to 0.1 $\mu$m.

After the formation of the contact layer 10, the supply of TMG and Et-$Cp_2Mg$ is stopped and, at the same time, TMA is introduced to start the growth of AlN cap layer 16 onto the p-type GaN contact layer 10 at 1050° C. At this time, the temperature should be hold substantially the same as that in the previous step only at the initial stage of the AlN growth.

Since only the initial stage of the AlN growth requires the sufficient amount of $NH_3$ to prevent the dissociation of nitrogen from the p-type GaN contact layer, the supply of $NH_3$ is largely reduced simultaneously with the starting of the growth of the AlN cap layer 16. For example, in the case of the embodiment, flow rate of $NH_3$ is reduced from 5 SLM (Standard Liter per Minute) for the p-type GaN contact layer 10, to 0.2 SLM upon growing the AlN cap layer 16. When the supply of TMA is stopped to thereby finish the growth of AlN cap layer 16 of 0.01 $\mu$m thick, the supply of $NH_3$ is stopped slightly earlier (1 to 10 seconds before).

The wafer shown in FIG. 2 is obtained as mentioned above.

The cooling down is started simultaneously with the stop of the supply of TMA and when a substrate temperature is equal to a room temperature, the wafer is taken out of the reactor.

The wafer is dipped into a 10% KOH aqueous solution heated to 85° C., thereby removing the AlN cap layer 16. Although the etching rate is fairly influenced by the crystalinity of the AlN cap layer 16, since the etch selectivity between GaN and AlN is extremely high, it is sufficient to set the etching time (simply) longer than necessary for complete removal of the AlN cap layer 16.

Figure 3:
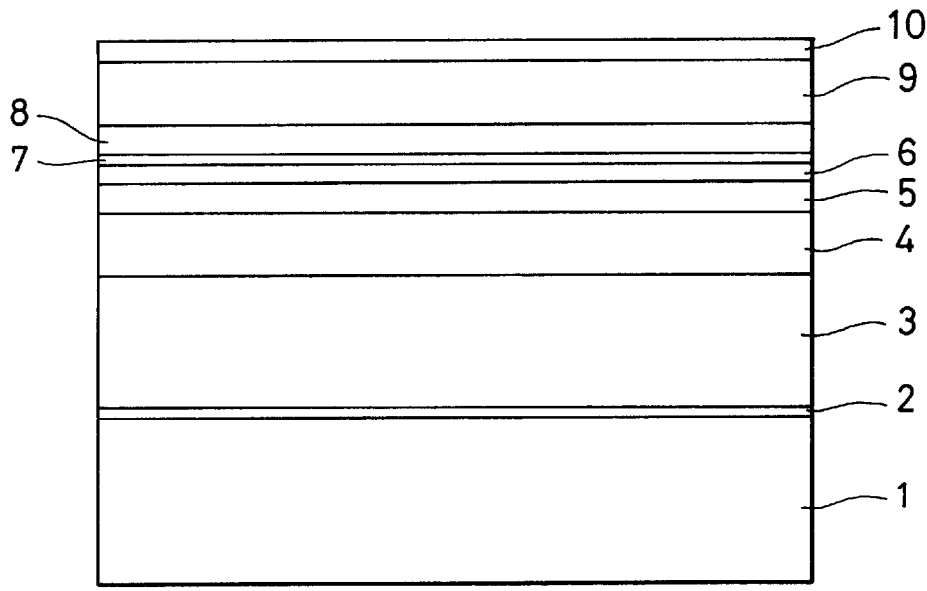

The wafer shown in FIG. 3 obtained as mentioned above is produced and it is called a sample 1.

As a prior art, a plurality of similar wafers are produced for the purpose of comparison by a conventional method which has no AlN cap layer growing step. That is, after the p-type GaN contact layer 10 with thickness of 0.1 $\mu$m was grown, the supply of TMG and Et-Cp$_2$Mg is stopped and the cooling is started. When the substrate temperature is equal to 400° C., the supply of $NH_3$ is stopped. When the substrate temperature is equal to the room temperature, the wafers are taken out of the reactor. In this case, the flow rate of $NH_3$ is held at a constant value of 5 SLM.

The resultant wafers are loaded into a heat treatment apparatus and a heat treatment is performed at 800° C. for 20 minutes in the nitrogen flow under the atmospheric pressure.

The control water obtained in this manner is called a sample 2.

Figure 4:
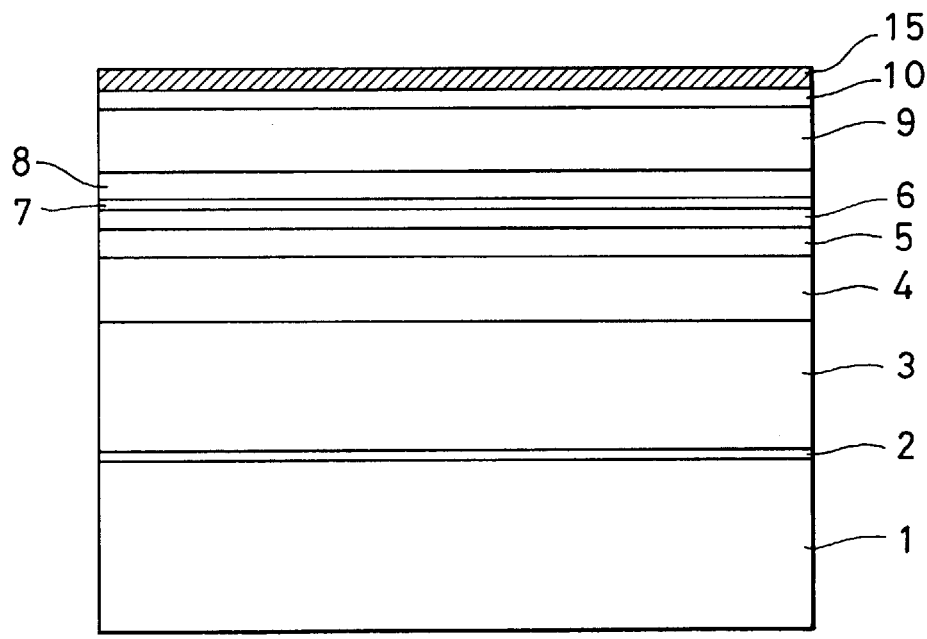

Subsequently, nickel (Ni) film 15 with a thickness of 200 nm is formed on the whole surface of each wafer of the produced samples 1 and 2 by using vacuum evaporation, as shown in FIG. 4.

Figure 5:
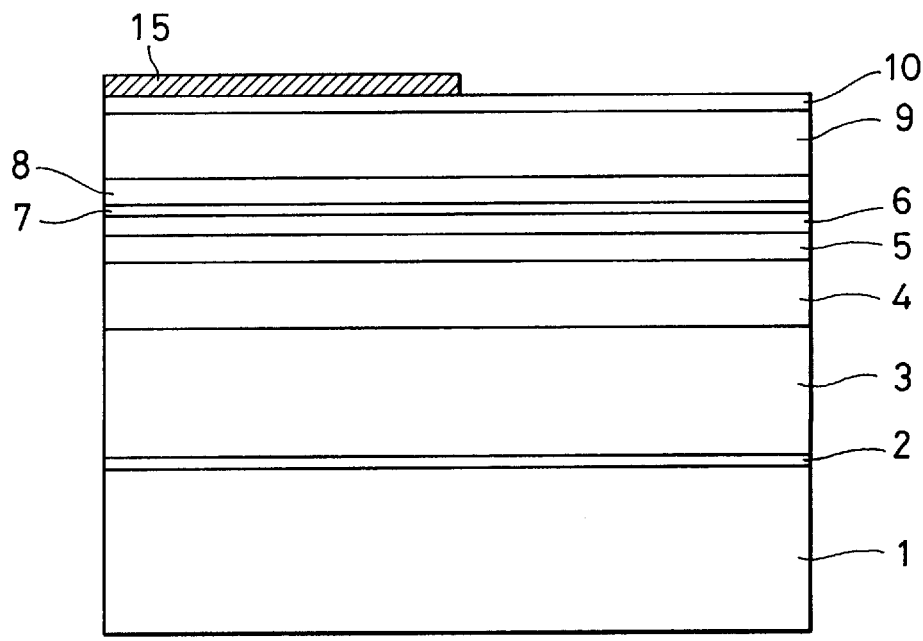

Then, the Ni film is partly removed by wet etching as shown in FIG. 5.

Figure 6:
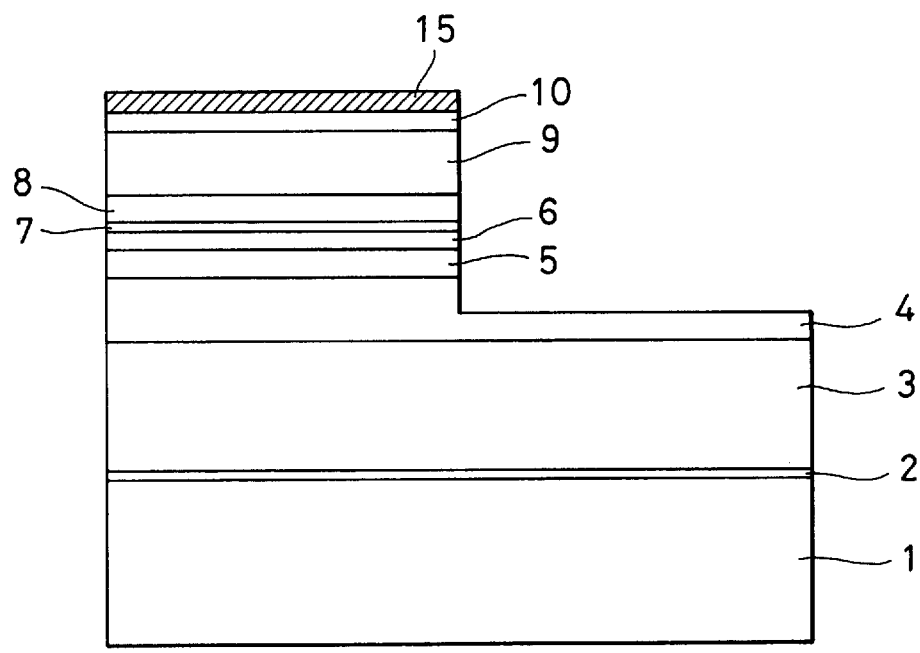

Subsequently, the exposed area of the nitride semiconductor layer is partially etched by reactive ion etching (RIE) using $Cl_2$ (chlorine) gas by utilizing the remaining Ni film 15 as a mask as shown in FIG. 6. In this case, the etching is performed down to a depth where the n-type cladding layer 4 is slightly left.

Figure 7:
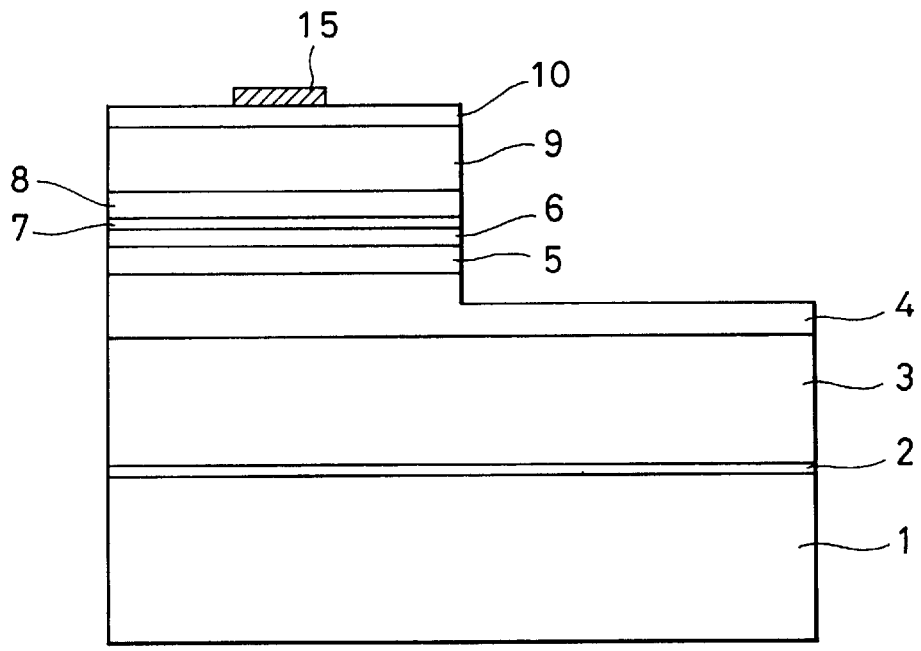

Then, as shown in FIG. 7, the Ni film is removed by wet etching while leaving a width of 5 $\mu$m to form the stripe 15 of the 5 $\mu$m-wide Ni film.

Figure 8:
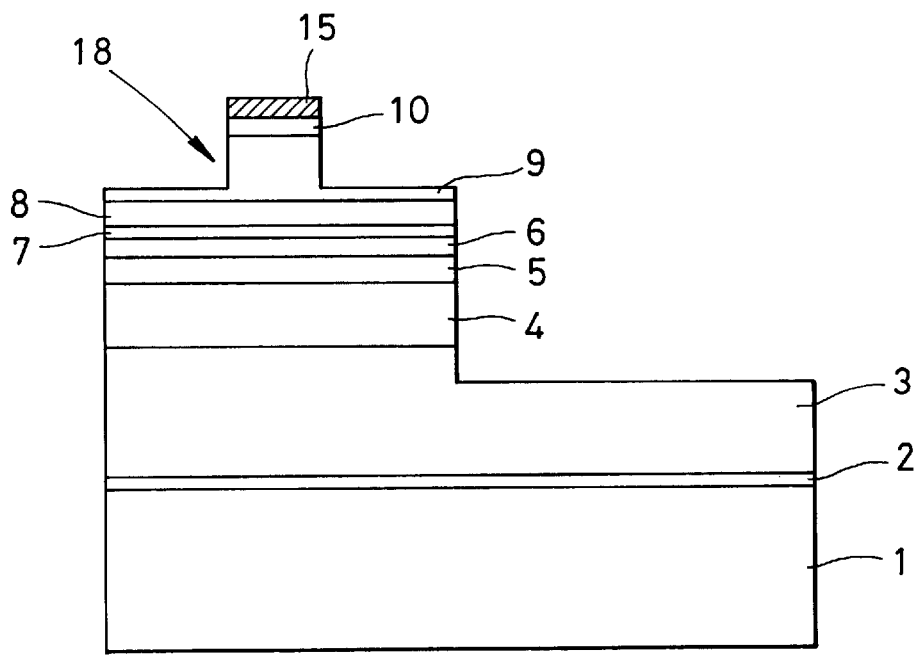

Next, as shown in FIG. 8, portions other than the portion immediately below the 5 $\mu$m-wide Ni stripe i.e., the contact layer 10 and p-type AlGaN cladding layer 9 are removed by reactive ion etching (RIE) using the Ni stripe 115 as a mask and leaving approximately 0.1 $\mu$m of the cladding layer 9 to form the narrow ridge structure 18. In this case, the remaining n-type cladding layer 4 is simultaneously removed and the n-type GaN ground layer 3 is exposed.

An $SiO_2$ protective film is deposited on each wafer by sputtering. Thereafter, a 3 $\mu$m-wide window on the p-type ridge and a window portion for an n-type electrode are formed in the $SiO_2$ protective film by a standard photolithography. Ti (titanium) is evaporated with a thickness of 50 nm and then, Al is evaporated with a thickness of 200 nm onto the portion where the n-type GaN layer 3 is exposed to form an n-side electrode 14. Then, a 50 nm-thick Ni film is evaporated and Au is evaporated with a thickness of 200 nm onto the portion where a p-type GaN layer is exposed to form a p-side electrode 13, thereby forming a devices shown in FIG. 1 on each wafer of samples 1 and 2.

Each wafer produced as mentioned above is cut into individual devices and voltage-current characteristics of the devices are measured.

Figure 9:
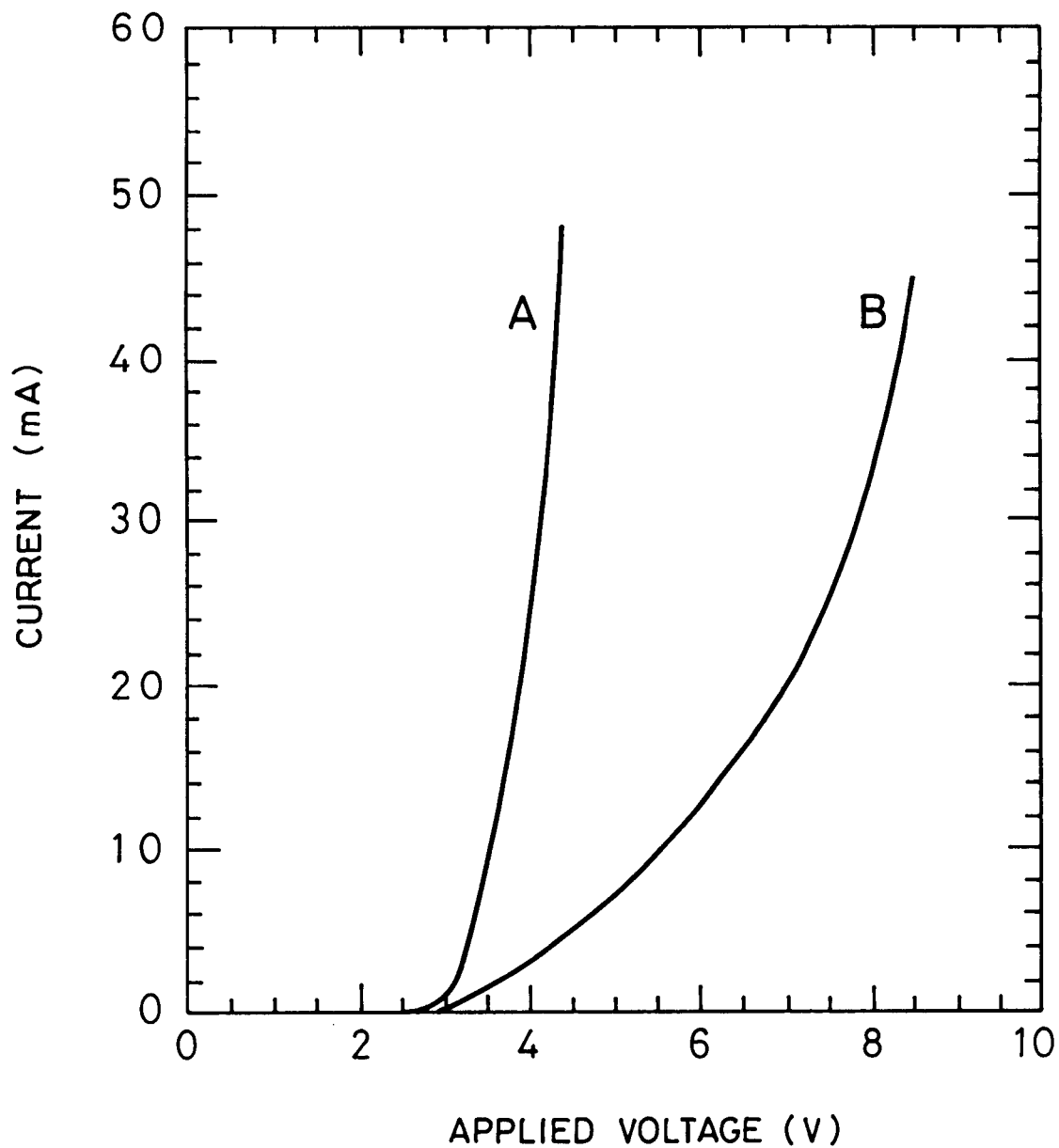
FIG. 9 is a graph showing voltage-current characteristics of the semiconductor laser produced by the embodiment according to the invention and a conventional semiconductor laser.

A curve "A" in FIG. 9 shows the voltage-current characteristics of the device produced from the wafer sample 1 processed by the method in the embodiment. For comparison with them, the voltage-current characteristics of the device produced from the sample 2 of the prior art are also shown by a curve "B" in the graph. The voltage-current characteristics "B" of the conventional device exhibits significant roundness in the leading portion and a turn-on voltage higher than 3.4V which is expected from the band cap of GaN, suggesting an existence of potential barrier at p-side electrode due presumable to the dissociation of nitrogen from the semiconductor surface during the heat treatment.

In the voltage-current characteristics "A" of the device according to the producing method of the invention, the leading portion is remarkably improved and it is shown that the contact of the electrode has been largely improved.

An operation and a mechanism according to the method of the invention will now be described in detail hereinbelow based on the embodiment.

When the group III nitride semiconductor crystal film $(Al_xGa_{1-x})_{1-y}In_yN$ ($0 \leq x \leq 1$, $0 \leq y \leq 1$) in which the group II element such as Mg or the like has been added is grown by MOCVD, hydrogen is incorporated into the film and the Mg impurity which should become an acceptor is passivated. The amount of hydrogen is almost equal to the amount of Mg added to the film and it is considered that hydrogen in the film in resides a bonded state with a form of Mg—H. A theoretical calculation has shown that Mg—H should be dissociated at a temperature of approximately 300° C. It is considered that the concentration of the hydrogen atoms therefore, in the Mg doped GaN film is much lower during the high temperature growth than in the as-grown after usual growth process. As mentioned in the description of "the third countermeasure method against the nitrogen dissociation problem", it is presumed that most portion of the hydrogen atoms present in the as-grown film are those entered from the ambient gas during the cooling step after the growth.

Those hydrogen atoms originate from the large amount of $NH_3$ supplied into the reactor. The requirement of the vast supply of $NH_3$ is a consequence of the extremely high equilibrium nitrogen pressure of GaN at high temperature 1000° C. at which the growth is performed. Insufficient ammonia flow would lead to the nitrogen dissociation and subsequent re-evaporation of the film rather than a growth. Simultaneously with that the large amount of $NH_3$ supplied dissolves to create a large amount of atomic hydrogen as well as active nitrogen species.

AlN, which is the material of the cap layer 16 in the invention, has much lower equilibrium nitrogen pressure. For example, as compared with the case of GaN where the equilibrium nitrogen pressure at 1400° C. exceeds 1000 bar, that of AlN is equal to mere 1E-8 bar. The $NH_3$ flow rate necessary for obtaining an AlN film is, therefore, much lower than that for the GaN growth. For this reason, the $NH_3$ flow rate can be exceptionally reduced during the growth of the AlN cap layer like the embodiment.

This fact also derives other advantage ,i.e., reduction of premature reaction between TMA and $NH_3$. It is well known that TMA (precursor for Al) readily reacts with $NH_3$ in a gas phase even at a low temperature, making the growth of the AlGaN mixed crystal difficult. By reducing the flow rate (namely, concentration in the gas phase) of $NH_3$ as in the embodiment, the flow rate of TMA can be set to be larger than usual. This means that the growth rate of the AlN cap layer can be raised, and since the growth time can be reduced, it is preferable when the present method is applied to mass production.

The $NH_3$ flow rate for the growth of the AlN cap layer in the embodiment is set to a value that is fairly larger than that necessary for film formation. When the growth of the AlN cap layer is finished, therefore, the shutoff of ammonia supply is set to precede the shutoff of TMA for a short period of time. Due to the thermal stability of AlN (at high temperature) as mentioned above, no significant surface degradation occurs even in the absence of $NH_3$. The hydrogen diffusion from residual $NH_3$ existing in the ambience during the cooling step can be further minimized.

The method of the invention is also advantageous from a viewpoint of long-term storage of the wafers. When GaN is held in the atmosphere for a long period, a contamination (considered to be an oxide film) is produced on the surface. Since GaN is chemically stable, easy method has not been established so far for removing the oxides by chemical etching. According to the method of the invention, the cap layer is formed in a clean ambience in the growth reactor and the surface is protected by AlN. As for the stored wafers, the clean surface can be easily restored by chemical etching just before the device forming process is started.

An AlGaN mixed crystal with a high AlN composition ratio ($\geq 0.7$) may be used as the material of the cap layer, as will be obviously understood from the above description, the most preferable effect is obtained in the case of using AlN. It is desirable that the AlN composition ratio of the cap layer is set to be 0.7 or more in order to obtain a sufficient selectivity in the chemical etching (alkaline aqueous solution) as in case of the embodiment and to obtain sufficient high-temperature stability.

It is well known that in the case of growing an AlGaN mixed crystal onto a GaN single crystal, micro cracks are easily formed in the AlGaN layer. This is because the lattice constant of AlGaN is slightly smaller than that of GaN and a tensile strain is generated in the AlGaN film.

When the cracks are formed in the cap layer, the cracks also propagate into the p-type GaN layer. Since the supply (amount) of $NH_3$ is exceptionally reduced during the growth of the cap layer as in the invention, it is conceivable that GaN may dissolve via the cracks, formed in the cap layer.

In the case of the embodiment, the thickness of the AlN cap layer 16 has been set to be 0.01 $\mu$m to avoid the generation of the cracks mentioned above. It is desirable to increase the film thickness in order to endure the effect of the cap layer. In this case, a good result is obtained by starting to lower the substrate temperature at the beginning of the growth of the AlN layer, thereby forming the most part of AlN film at lower temperature of approximately 400 to 600° C. (excluding the initial stage of its growth). This is because AlN formed at the low temperature of approximately 400 to 600° C. becomes polycrystalline or amorphous and the cracks hardly occur.

If the cooling is started just at the end of the growth of the Mg doped p-type GaN contact layer 10 and it the AlN layer is formed only at a low temperature of 400 to 600° C., the restriction against the film thickness of the AlN layer is largely reduced. However, hydrogen diffuses into Mg doped GaN crystal during the cooling step from the ambience where a large quantity of $NH_3$ exist and, thereafter, the AlN capps the crystal, so that the effect of the invention is not derived. If the temperature is lowered after reducing the flow rate of $NH_3$ to such a value that hydrogen does not diffuse into GaN, a nitrogen dissociation occurs on the GaN layer surface, so that the effect of the invention is not derived.

An ammonia detector may be attached on the gas exhaust line of the growth reactor. The shutoff of TMA and the cooling may be performed at the time when the indication of the detector falls below a predetermined value. By this method, the timing is easily matched to the time point when the $NH_3$ has just been purged from the reactor.

When the growth of AlN is performed, by using nitrogen as the carrier gas, an amount of $NH_3$ to be supplied can be further reduced and a p-type crystal of a higher hole concentration can be obtained.

According to the invention, the second crystal layer made of a material having a sufficient selectivity in chemical etching to the first crystal layer GaN contact layer is formed onto the first crystal layer, the supply amount of nitrogen precursor to be introduced into the reactor vessel during the growth of the second crystal layer is greatly reduced, and after the completion of the growth, the second crystal layer is removed by chemical etching, so that the hole concentration near the surface of the first crystal layer is improved.

What is claimed is:

1. A method of producing a group III nitride semiconductor device, comprising the steps of:

forming a first crystal layer by a metalorganic chemical vapor deposition method made of a group III nitride semiconductor $(Al_xGa_{1-x})_{1-y}In_yN$ ($0 \leq x \leq 1$, $0 \leq y \leq 1$) doped with a group II impurity element;

forming a second crystal layer by a metalorganic chemical vapor deposition method made of a second group III nitride semiconductor $Al_zGa_{1-z}N$ ($0.7 \leq z \leq 1$) onto the first crystal layer; and removing at least a part of the second crystal layer by etching after the formation of the first and second crystal layers;

wherein a nitrogen precursor in the metalorganic compound chemical vapor deposition method is ammonia, and the amount of ammonia supplied into the reactor vessel is set much lower during the growth of the second crystal layer and the subsequent cooling step or during the cooling step alone than that for the growth of the first crystal layer.

2. A method of producing a group III nitride semiconductor device, comprising the steps of:

forming a first crystal layer by a metalorganic chemical vapor deposition method made of a group III nitride semiconductor $(Al_xGa_{1-x})_{1-y}In_yN$ ($0 \leq x \leq 1$, $0 \leq y \leq 1$) doped with a group II impurity element;

forming a second crystal layer formed by a metalorganic chemical vapor deposition method made of a second group III nitride semiconductor $Al_zGa_{1-z}N$ ($0.7 \leq z \leq 1$) onto the first crystal layer; and removing at least a part of the second crystal layer by etching after the formation of the first and second crystal layers;

wherein a nitrogen precursor in the metalorganic compound chemical vapor deposition method is ammonia, and at the end of formation of the second crystal layer, the supply of ammonia is stopped earlier than the time of stopping the supply of a group III precursor to the reactor.

3. A method according to claim 2, wherein at the end of formation of the second crystal layer, when an indication of an ammonia detector falls below a threshold value, the supply of the group III precursor is stopped, and a cooling is performed.

4. A method of producing a group III nitride semiconductor device, comprising the steps of:

forming a first crystal layer made of a group III nitride semiconductor $(Al_xGa_{1-x})_{1-y}In_yN$ ($0 \leq x \leq 1$, $0 \leq y \leq 1$) doped with a group II impurity element;

forming a second crystal layer made of a second group III nitride semiconductor $Al_zGa_{1-z}N$ ($0.7 \leq z \leq 1$) onto the first crystal layer; and removing at least a part of the second crystal layer by etching after the formation of the first and second crystal layers;

wherein the step of forming the second crystal layer includes a usage of nitrogen gas for a carrier gas.

5. A method according to claim 1, wherein the step of forming the second crystal layer is started at substantially the same temperature as a forming temperature of the first crystal layer.

6. A method according to claim 2, wherein the step of forming the second crystal layer is started at substantially the same temperature as a forming temperature of the first crystal layer.

7. A method according to claim 3, wherein the step of forming the second crystal layer is started at substantially the same temperature as a forming temperature of the first crystal layer.

8. A method according to claim 4, wherein the step of forming the second crystal layer is started at substantially the same temperature as a forming temperature of the first crystal layer.

\* \* \* \* \*